United States Patent [19]

Kato et al.

[11] Patent Number: 5,436,918
[45] Date of Patent: Jul. 25, 1995

[54] CONVOLUTIONAL ENCODING/DECODING APPARATUS WITH FIXED BIT INSERTION

[75] Inventors: Osamu Kato, Yokohama; Kazuyuki Miya, Machida, both of Japan

[73] Assignee: Matsushita Electric Industrial Co., Ltd., Osaka, Japan

[21] Appl. No.: 929,833

[22] Filed: Aug. 14, 1992

[30] Foreign Application Priority Data

Aug. 23, 1991 [JP] Japan .................. 3-212285

[51] Int. Cl.6 ............................. H03M 13/12
[52] U.S. Cl. ..................................... 371/43
[58] Field of Search ................. 371/43, 44, 45, 46

[56] References Cited

U.S. PATENT DOCUMENTS

| | | | |
|---|---|---|---|
| 4,888,769 | 12/1989 | Deal | 370/50 |
| 4,908,827 | 3/1990 | Gates | 371/43 |
| 5,128,942 | 7/1992 | Kojima | 371/5.5 |

OTHER PUBLICATIONS

Hagenauer, J. et al., "The Performance of Rate-Compatible Punctured Convolutional Codes for Future Digital Mobile Radio", IEEE CH2622-9, 1988, pp. 22-29.

*Primary Examiner*—Stephen M. Baker
*Attorney, Agent, or Firm*—Stevens, Davis, Miller & Mosher

[57] ABSTRACT

The invention intends to improve an error correcting capability in an error correction encoding/decoding apparatus. On the encoding side, after a fixed bit of 0 or 1 was inserted into information signal series to be convolutional correction encoded, the resultant information signal series is convolutionally encoded. On the decoding side, by using the fixed bit inserting position stored in a fixed bit inserting position storing circuit, the information signal series is decoded while limiting the state transition corresponding to the bit position at which the information bit is the fixed bit into only one kind that is decided by the value of the fixed bit.

9 Claims, 8 Drawing Sheets

FIG. 5A

| 1 | 2 | 3 | 4 | 5 | 6 | 7 | 8 | 9 | 10 | 11 | 12 | 13 | 14 |
|---|---|---|---|---|---|---|---|---|----|----|----|----|----|

FIG. 5B

| 1 | 2 | 3 | 4 | 5 | 6 | 7 | $B_1$ | 8 | 9 | $B_2$ | 10 | 11 | 12 | 13 | 14 |
|---|---|---|---|---|---|---|-------|---|---|-------|----|----|----|----|----|

CONVOLUTIONAL ENCODING/DECODING APPARATUS WITH FIXED BIT INSERTION

CROSS-REFERENCE TO RELATED APPLICATION

This application relates to U.S. Ser. No. 07/928,402, entitled "Error Correction Encoding/Decoding Method and Apparatus therefor" filed on Aug. 12, 1992, by Kazuyuki Miya and Osamu Kato, now abandoned, and assigned to the present assignee, based on Japanese Application No. 3-212286 filed on Aug. 23, 1991.

BACKGROUND OF THE INVENTION

The invention relates to an error correction encoding/decoding apparatus which is used in a digital automobile telephone or the like.

Hitherto, in a system using a radio transmission of a digital automobile telephone or the like as a transmission line a strong error correction encoding is performed so that an information data transmission quality of a predetermined level or higher can be held even in case of an inferior transmission path quality (high line bit error ratio). There is a convolutional code as one of such strong error correction codes. As a decoding method of the convolutional code, a Viterbi decoding for performing a maximum likelihood decoding by using a trellis diagram is known. The Viterbi decoding has been disclosed in "Points of Error Correction Encoding Technique", Japan Industrial Technology Center Co., Ltd., published on Mar. 20, 1986, pages 45 to 48.

FIG. 1 shows a construction of a conventional error correction encoding/decoding apparatus. FIG. 1A shows a block diagram on the encoding side. FIG. 1B shows a block diagram on the decoding side. In FIG. 1, an example using a low-bit-rate coded voice signal is shown as an example of an information signal for error correction encoding.

In FIG. 1A, reference numeral 21 denotes a voice signal which is converted into a low-bit-rate coded voice signal by a voice encoding circuit 22. Reference numeral 23 denotes a convolutional error correction encoding circuit for error correction encoding all of or a part of the converted low-bit-rate coded voice signal. Reference numeral 24 denotes a low-bit-rate coded voice signal which has been error correction encoded. The signal 24 is transmitted as a transmission signal by a radio transmission.

In FIG. 1B, reference numeral 25 denotes a low-bit-rate coded voice signal which has been error correction encoded. The signal 25 is error correction decoded by a convolutional error correction decoding circuit 26. Reference numeral 27 denotes a voice decoding circuit to decode the error correction decoded low-bit-rate coded voice signal to a voice signal 28.

FIG. 2 shows a construction of the convolutional error correction encoding circuit 23. As an example of the encoding, a encoding rate (ratio between the number of bits of the information signal and the number of bits of the transmission signal) $R = \frac{1}{2}$ and a constraint length (the number of information bits regarding the generation of the transmission signal) $K = 3$.

An information signal series 29 is supplied to shift registers 30 and 31 in accordance with the order of $X_0$, $X_1$, $X_2$, .... The exclusive ORs of the input value of the information signal series 29 and output values of the shift registers 30 and 31 are calculated by exclusive OR circuits 32, 33, and 34, respectively, so that transmission signal series (convolutionally coded signals) 35 and 36 are obtained. The transmitting order of the signals which are transmitted by the radio transmission is set to $Y_0$, $Y_1$, $Y_2$, $Y_3$, ....

FIG. 3 shown a state transition diagram called a trellis diagram which is used when the convolutional error correction decoding method (Viterbi decoding) is executed. States $S_0$ to $S_3$ indicate values of the shift registers 30 and 31 in the coding. $S_0$ indicates $(R_0, R_1) = (0, 0)$; $S_1 (R_0, R_1) = (1, 0)$; $S_2 (R_0, R_1) = (0, 1)$; and $S_3 (R_0, R_1) = (1, 1)$.

The trellis diagram is a diagram in which a branch to the transition destination state in the case where 0 or 1 has been supplied as an information signal in each of the states $S_0$ to $S_3$ is shown for continuous information signal bit series. For example, in case of $S_2$, when 0 is supplied as an information signal, the next state is set to $S_0$, and when 1 is supplied, the next state is set to $S_1$, so that the state is branched from $S_2$ to $S_0$ and $S_1$. A branch line from each of the states to the next state is called a branch. Continuous branches corresponding to the information signal series $X_0$, $X_1$, $X_2$, ... are called paths. All of the information signal series (each of $X_0$, $X_1$, $X_2$, ... can have 0 or 1) can be expressed by either one of the paths of the trellis diagram.

The Viterbi decoding is a method whereby reception signal series $Y_0'$, $Y_1'$, $Y_2'$, $Y_3'$, ... and transmission signal series $Y_0$, $Y_1$, $Y_2$, $Y_3$, ... corresponding to the respective paths (namely, the respective information signal series) are compared for all of the paths, the maximum likelihood series as a transmission signal series is discriminated, the information signal series corresponding to the maximum likelihood transmission signal series is determined to be the information signal series $X_0$, $X_1$, $X_2$, ... which has been convolution encoded on the transmission side, and it is decoded into the information signal series.

As mentioned above, even in the conventional error correction encoding/decoding apparatus, even if a line error has occurred in the transmission signal series $Y_0$, $Y_1$, $Y_2$, $Y_3$, ... and it has been changed to the reception signal series $Y_0'$, $Y_1'$, $Y_2'$, $Y_3'$, ... on the decoding side, so long as such a line error lies within an error correcting capability of the convolutional code, the information signal can be correctly reproduced on the decoding side by the Viterbi decoding.

In the above conventional error correction encoding/decoding apparatus, however, there is a problem such that when the line bit error ratio is high and exceeds the correcting capability of the convolutional code, the correct information signal cannot be reproduced by the error correction decoding and a bit error remains.

SUMMARY OF THE INVENTION

It is an object of the invention to provide an excellent error correction encoding/decoding apparatus which can obtain a lower residual bit error ratio for the same line bit error ratio.

To accomplish the above object, according to the invention, a fixed value (0 or 1) of one or a plurality of bits is inserted into the information signal series to be error correction encoded and, after that, the information signal series is error correction encoded, and in the error correction decoding, a state transition corresponding to a fixed bit position is limited to only one kind that is determined by the value (0 or 1) of the fixed bit.

According to the invention, therefore, branches as many as the number of inserted bits can be narrowed down to one kind of correct branch on the way of a path of a trellis diagram and the error correcting capability of the convolutional code, particularly, the error correcting capability for the information signals before and after the bit position into which the fixed bit has been inserted can be improved.

BRIEF DESCRIPTION OF THE DRAWINGS

FIG. 5A is a diagram showing a bit stream of an input (before a plurality of fixed bits are inserted) of a fixed bit inserting section in the apparatus of FIG. 4A;

FIG. 5B is a diagram showing a bit stream of an output (after a plurality of fixed bits were inserted) of the fixed bit inserting section;

DESCRIPTION OF THE PREFERRED EMBODIMENTS

Figure 1A:
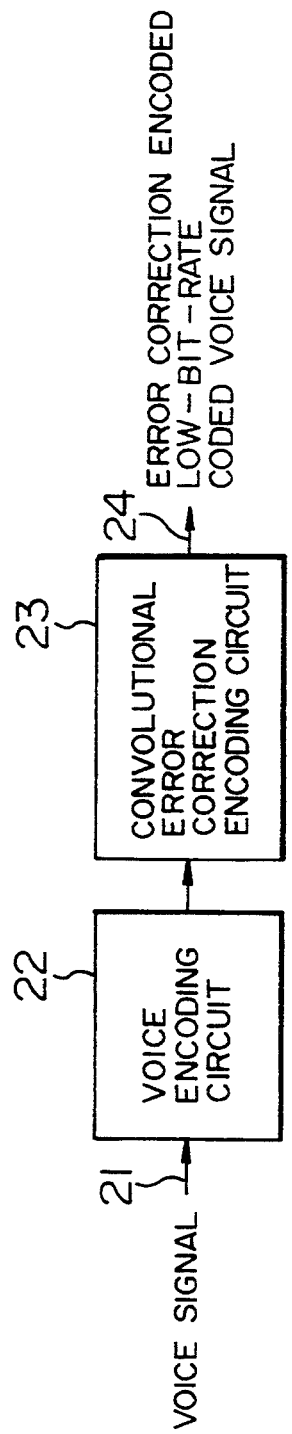
FIG. 1A is a schematic block diagram on the encoding side of an error correction encoding/decoding apparatus in a conventional example.
Figure 1B:
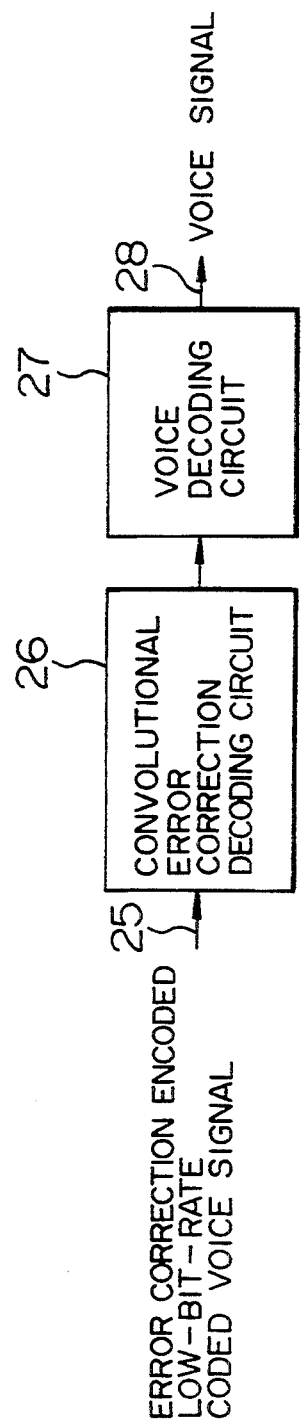
FIG. 1B a schematic block diagram on the decoding side in the apparatus of FIG. 1A.
Figure 2:
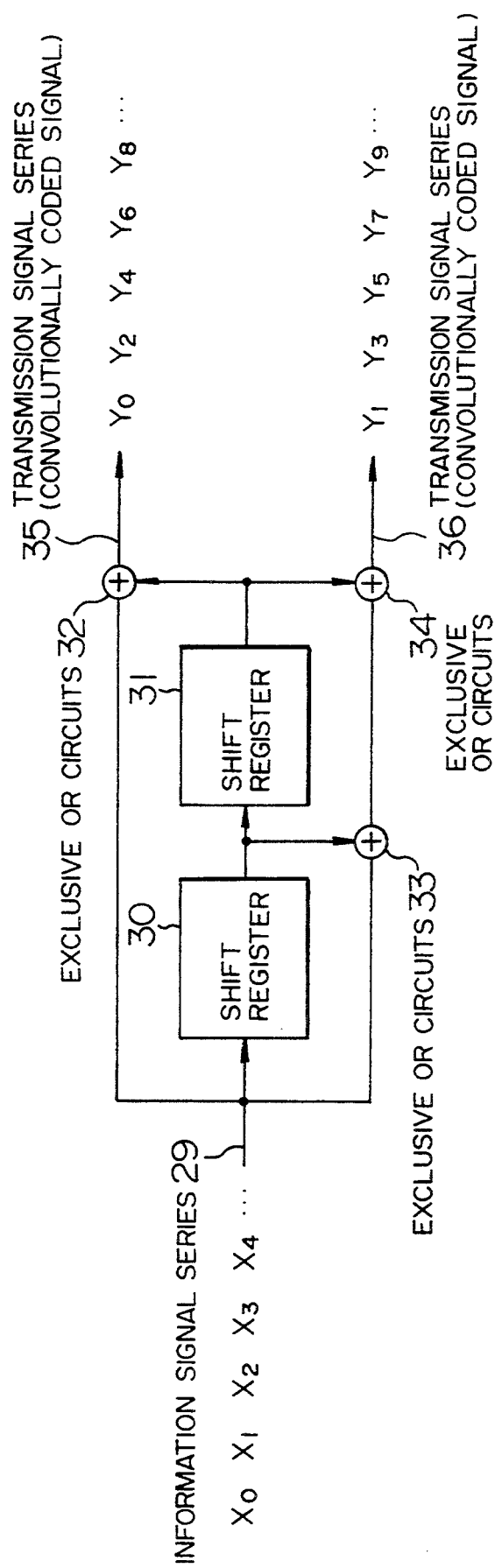
FIG. 2 is a schematic block diagram of a convolutional error correction encoding circuit in the apparatus of FIG. 1A.
Figure 3:
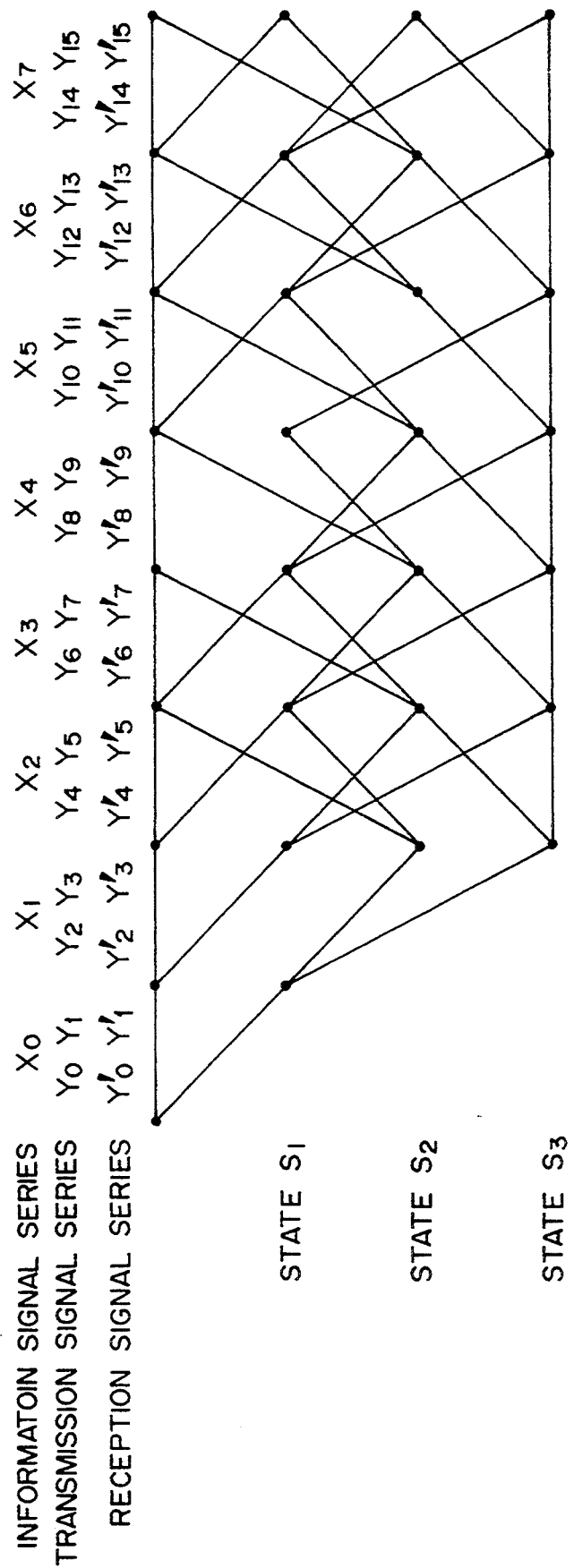
FIG. 3 is a trellis diagram for explaining the operation of a convolutional error correction decoding circuit in the apparatus of FIG. 1A.
Figure 4A:
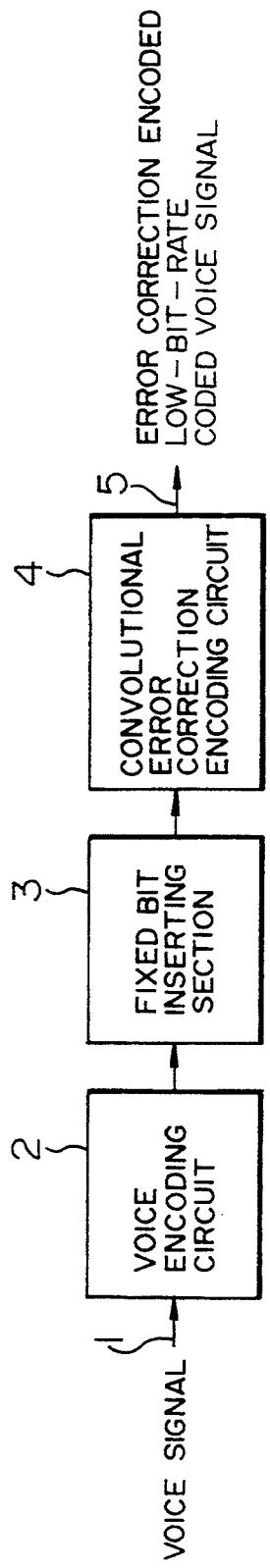
FIG. 4A is a schematic block diagram on the encoding side of an error correction encoding/decoding apparatus according to an embodiment of the invention.
Figure 4B:
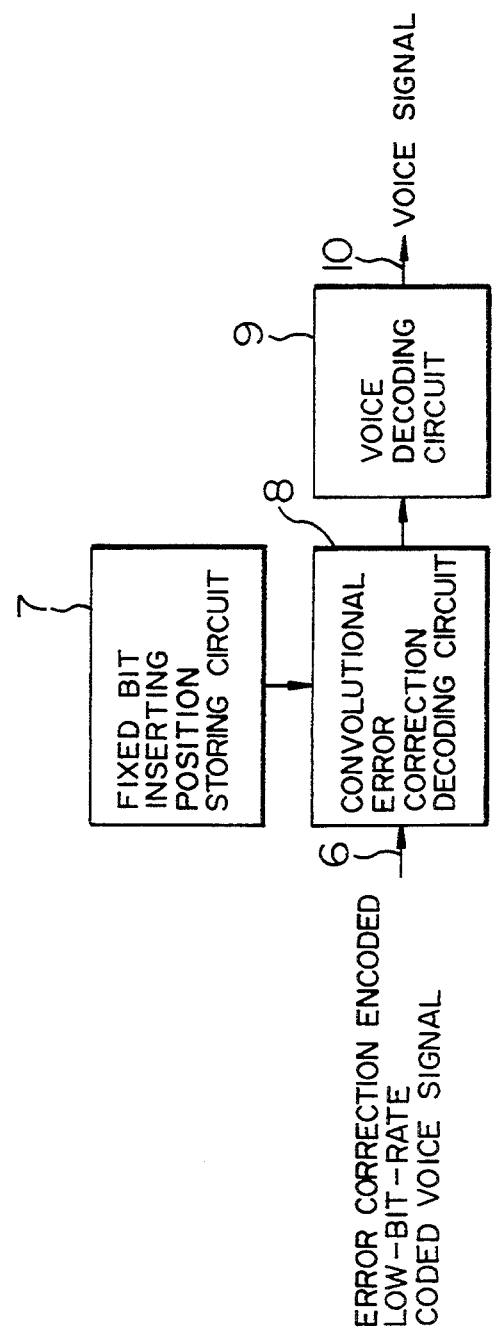
FIG. 4B is a schematic block diagram on the decoding side in the apparatus of FIG. 4A.

FIGS. 4A and 4B show a construction of an error correction encoding/decoding apparatus in an embodiment of the present invention. FIG. 4A shows a block diagram on the encoding side. FIG. 4B is a block diagram on the decoding side. In FIGS 4A and 4B, the case of using a low-bit-rate coded voice signal is shown as an example of an information signal for error correction encoding.

In FIG. 4A, reference numeral 1 denotes a voice signal to be transmitted; 2 a voice encoding circuit; 3 a fixed bit inserting section; 4 a convolutional error correction encoding circuit; and 5 an error correction encoded low-bit-rate coded voice signal to be transmitted. In FIG. 4B, reference numeral 6 denotes an error correction encoded low-bit-rate coded voice signal which has been received; 7 a fixed bit inserting position storing circuit; 8 a convolutional error correction decoding circuit; 9 a voice decoding circuit; and 10 a decoded voice signal.

The operation of the embodiment will now be described. The voice signal 1 is converted into the low-bit-rate coded voice signal by the voice encoding circuit 2 by using a VSELP (Vector Sum Excited Linear Prediction) method or the like. A fixed value (0 or 1) of one or a plurality of bits is inserted by the fixed bit inserting unit 3 to all of or a part of the information signal for error correction encoding. The information signal is subsequently error correction encoded by the convolutional error correction encoding circuit 4. The error correction encoded low-bit-rate voice signal 5 is transmitted by the radio transmission. FIGS. 5A and 5B show bit streams before and after a plurality of fixed bits are/were inserted by the fixed bit inserting section 3, respectively. The inserted fixed bits are set to $B_1$ and $B_2$ here. In the embodiment, as will be also clearly understood from FIGS. 5A and 5B, the fixed bit inserting section 3 inserts the fixed bits to positions near the central portion of the encoding information bit data. In case of inserting a plurality of bits, they can be inserted concentratedly or distributively.

On the other hand, the error correction encoded low-bit-rate coded voice signal 6 which has been received on the decoding side is error correction decoded by the convolutional error correction decoding circuit 8 by using the fixed bit inserting position information stored in the fixed bit inserting position storing circuit 7, and then it is further decoded into the voice signal 10 by the voice decoding circuit 9. The inserting positions of the fixed bits in the bit stream are set to predetermined positions in the embodiment.

The construction and operation of the convolutional error correction encoding circuit 4 in the embodiment will now be described further in datail with reference to FIG. 6. As an example of the encoding, a encoding rate $R = \frac{1}{2}$ and a constraint length $K = 3$.

Figure 6:
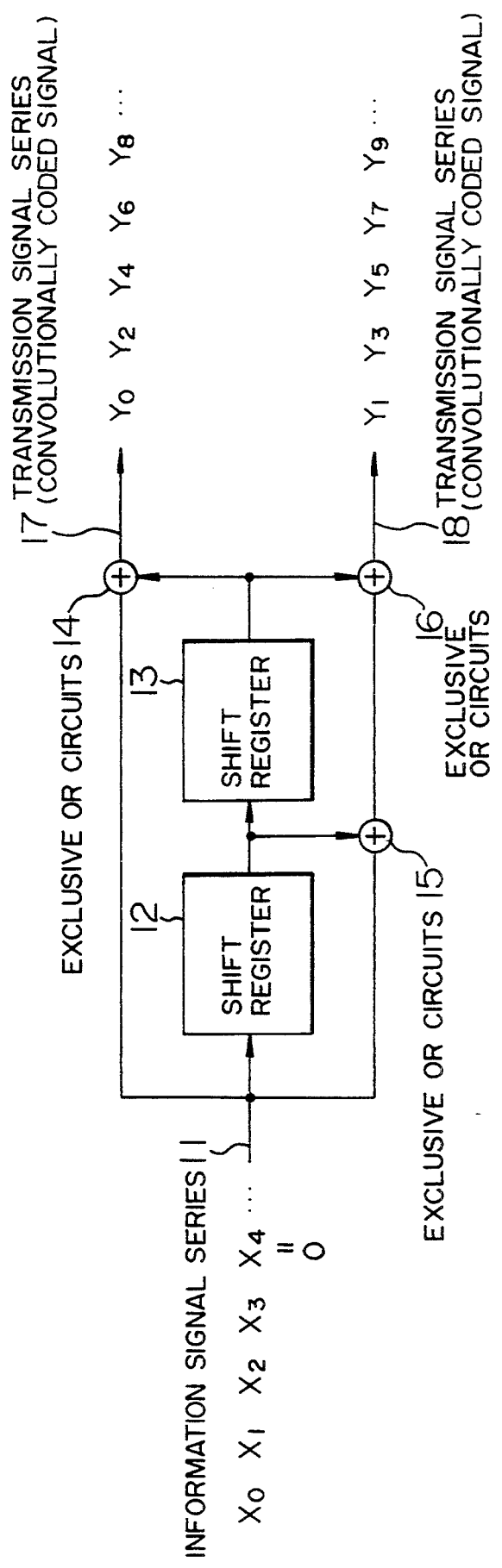
FIG. 6 is a schematic block diagram of an error correction encoding circuit in the apparatus of FIG. 4A.

In FIG. 6, reference numeral 11 denotes an information signal series such as $X_0, X_1, X_2, \ldots$ or the like; 12 and 13 shift registers; 14, 15, and 16 exclusive OR circuits; 17 and 18 transmission signal series. The encoding circuit in FIG. 6 has substantially the same construction and operation as those in the conventional example except that one or a plurality of bits in $X_0, X_1, X_2, \ldots$ of the information signal series 11 are the fixed bits inserted by the fixed bit inserting section 3. That is, the information signal series 11 is sequentially supplied to the shift registers 12 and 13 in accordance with the order of $X_0, X_1, X_2, \ldots$. The exclusive ORs of the input value of the information signal series 11 and output values of the shift registers 12 and 13 are calculated by the exclusive OR circuits 14, 15, and 16, respectively, so that a transmission signal series (convolutionally coded signals) 17 and 18 is obtained. The transmission order of the signals which are transmitted by the radio transmission is set to the order of $Y_0, Y_1, Y_2, Y_3, \ldots$. It is now assumed that $X_4$ in the information signal series 11 is a fixed bit and has a value 0.

Figure 7:
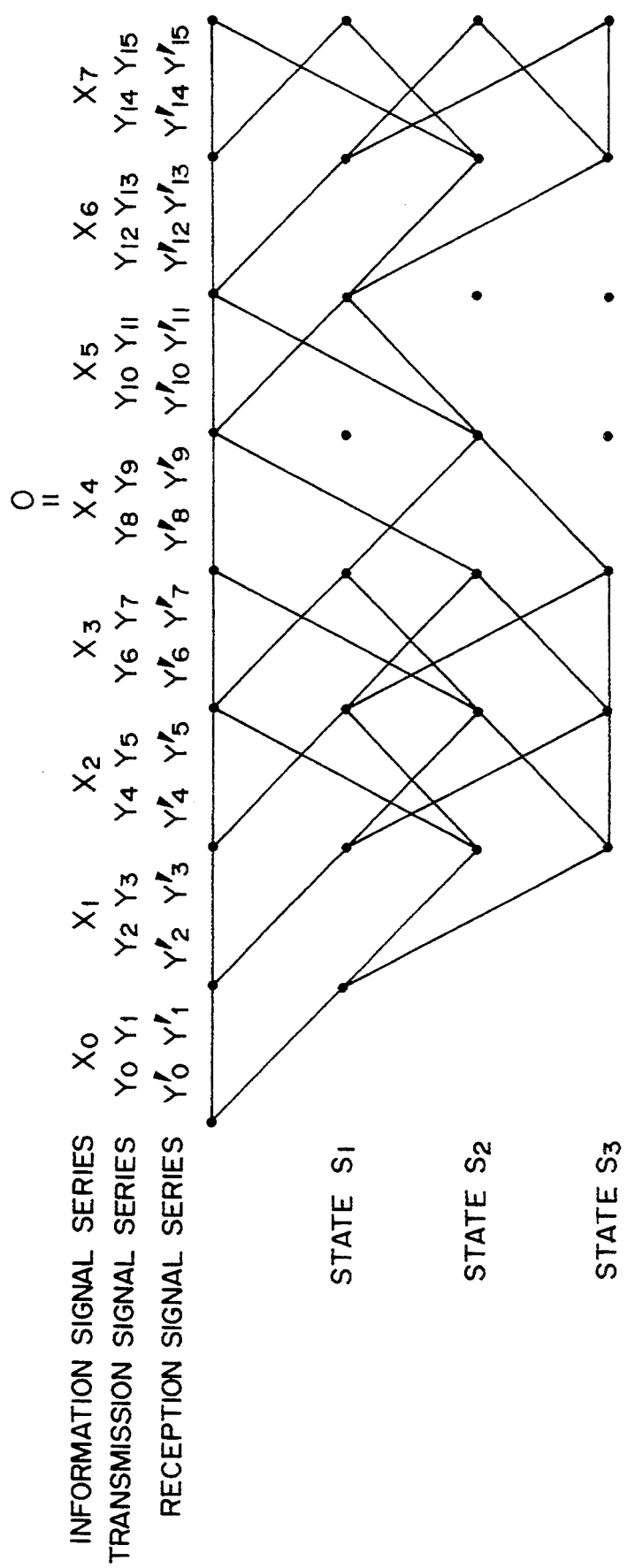
FIG. 7 is a trellis diagram for explaining the operation of a convolutional error correction decoding circuit in the apparatus of FIG. 4A.

FIG. 7 is a trellis diagram when the convolutional error correction decoding method (Viterbi decoding) in the above embodiment is executed. The states $S_0$ to $S_3$ indicate the values of the shift registers 12 and 13 in the encoding. $S_0$ indicates $(R_0, R_1) = (0, 0)$; $S_1 (R_0, R_1) = (1, 0)$; $S_2 (R_0, R_1) = (0, 1)$; and $S_3 (R_0, R_1) = (1, 1)$.

In the embodiment as well, in a manner similar to the conventional example, the reception signal series $Y_0', Y_1', Y_2', Y_3', \ldots$ and the transmission signal series $Y_0, Y_1, Y_2, Y_3, \ldots$ corresponding to the paths are compared for all of the paths, the maximum likelihood series is discriminated the transmission signal series, the information signal series corresponding to the transmission signal series is determined to be the information signal series $X_0, X_1, X_2, \ldots$ which has been convolutionally encoded on the transmission side, and it is decoded into the information signal series.

In the embodiment, however, since the fixed bits have been inserted into the information signal (for instance, $X_4=0$ is the fixed bit here), the state transition corresponding to the fixed bits can be narrowed down to the correct branch of only one kind for each of the states $S_0$ to $S_3$ in a manner such that $S_0$—$S_0$, $S_1$-$S_2$, $S_2$-$S_0$, and $S_3$-$S_2$. The state transition of the trellis diagram for the information signal $X_4$ can be reduced as shown in FIG. 7. Therefore, a probability such that a path in which $X_4$ is erroneously decoded is selected as a path that is finally selected can be set to 0. It is possible to reduce the probability such that an erroneous correction of the information signal near $X_4$ is executed in the convolutional code which occasionally propagates decoding bit errors.

In the above embodiment, significant bits of high error sensitivities in the information signal to be error correction encoded are arranged to not only the first and last positions of a code word in which an error correcting capability of the convolutional code is inherently high but also positions near the positions before and after the inserted fixed bits, so that the data transmission can be performed at a higher quality. That is, by inserting the fixed bits to not only the first and last positions of the code word in which the error correcting capability of the convolutional code is inherently high but also positions near the center of the bit stream and by arranging the significant bits having high error sensitivities to positions near the fixed bits, a bit error probability is reduced.

Figure 8A:
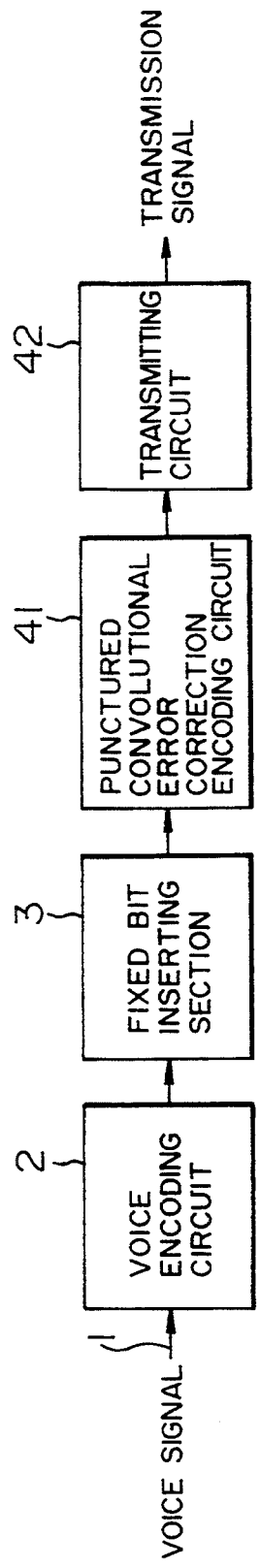
FIGS. 8A and 8B are schematic block diagrams showing another embodiment.
Figure 8B:
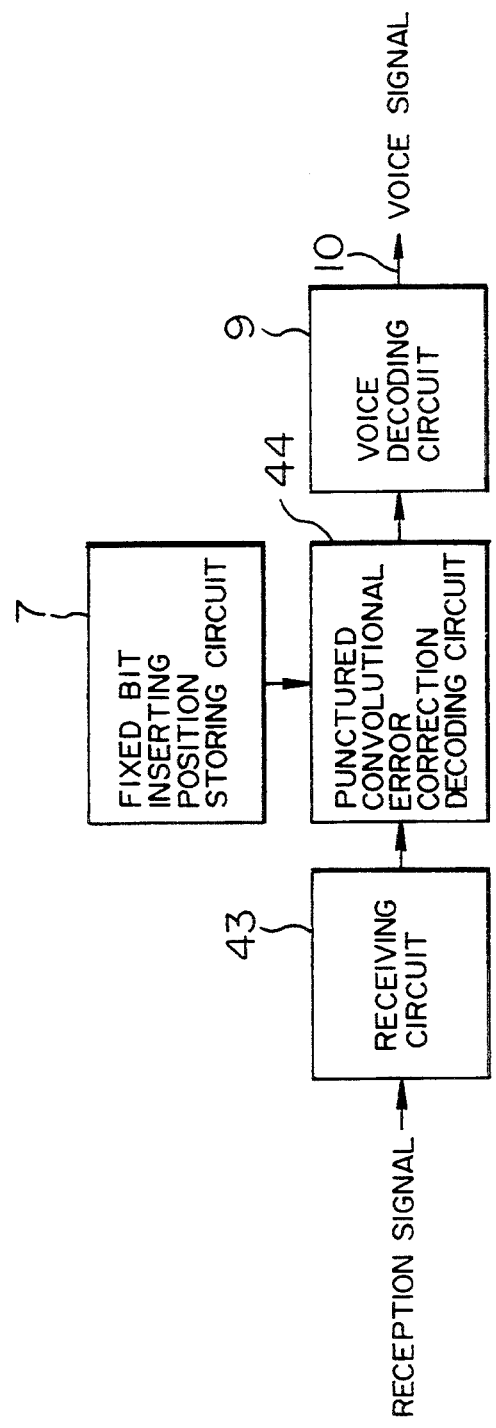

FIGS. 8A and 8B show another embodiment. FIGS. 8A and 8B show schematic block diagrams on the encoding side and decoding side, respectively. Since fundamental constructions are similar to those of the embodiment shown in FIGS. 4A and 4B, only different portions will be explained.

In a punctured convolutional error correction encoding circuit 41, the information signal series into which the fixed bits have been inserted by the fixed bit inserting section 3 is convolutionally encoded and a proper number of bits are erased and the resultant coded information signal series are transmitted from a transmitting circuit 42. On the decoding side, the signal (reception signal) which has been transmitted from the encoding side and passed through a transmission line is received by a receiving circuit 43. Subsequently, the reception signal is error correction decoded by a punctured convolutional error correction decoding circuit 44 by using the fixed bit inserting position information stored in the fixed bit inserting position storing circuit 7. The error correction decoded signal is further decoded into the voice signal 10 by the voice decoding circuit 9. The punctured convolutional encoding has been described in detail in "The Papers of The Institute of Electronics Information and Communication Engineers of Japan", Vol. J64-B, No. 7, pages 574–580, July, 1981, or the like, so that its description is omitted here. In the case of the embodiment, an amount of reduction of the encoding rate due to the insertion of the fixed bits is compensated by the punctured coding, so that a higher encoding rate can be obtained.

Further, there is an advantage such that by properly setting the number of fixed bits to be inserted, a flexibility can be given to the encoding rate of the convolutional code. Namely, the encoding rate R is not limited to only $R=\frac{1}{2}$ but can be also set to a value such as $R=\frac{1}{2}.1$ or $\frac{1}{2}.3$.

In other words, for instance, in case of devising an error correction encoding method on the assumption that the number of voice information bits (voice encoding rate) and the total number of bits (voice encoding rate+error correction encoding rate) are decided to predetermined values, a feature of the invention such that the error correction encoding rate can be set to a desired value is very advantageous.

We claim:

1. An error correction encoding/decoding apparatus comprising:

an error correction encoding apparatus having a fixed bit inserting section to insert at least one fixed bit having a fixed value into at least one inserting position of an information signal series to be convolutional error correction encoded and a convolutional error correction encoding circuit which receives and encodes the information signal series into which the at least one fixed bit has been inserted to obtain a transmission signal; and an error correction decoding apparatus having a fixed bit inserting position storing circuit to store the at least one inserting position and a convolutional error correction decoding circuit for executing a maximum likelihood decoding of the transmission signal while limiting a determination of a state transition corresponding to the at least one inserting position to only one kind that is determined by the fixed value.

2. An apparatus according to claim 1, wherein the fixed value which is inserted is equal to 0 or 1.

3. An apparatus according to claim 1, wherein said at least one inserting position is in a central portion of the information signal series.

4. An apparatus according to claim 1, wherein bits in the information signal series having error sensitivities above a threshold value are arranged adjacent to the at least one fixed bit.

5. An apparatus according to claim 1, wherein said at least one fixed bit comprises a single bit inserted between two consecutive bits of the information signal series.

6. An apparatus according to claim 1, wherein said maximum likelihood decoding comprises Viterbi decoding, and wherein said convolutional error correction decoding circuit determines only one branch from each possible state corresponding to said at least one fixed bit, whereby a probability of selecting a path in which said at least one fixed bit is erroneously decoded is set to zero.

7. An error correction encoding/decoding apparatus comprising:

voice encoding means for encoding a voice signal to generate an information signal series;

fixed bit inserting means for inserting at least one fixed bit having a fixed value into at least one inserting position of said information signal series;

error correction encoding means for receiving the information signal series in which the at least one fixed bit has been inserted and for punctured convolutional error correction encoding said information signal series and said at least one fixed bit to obtain a punctured convolutional error correction encoded signal;

transmitting means for transmitting the punctured convolutional error correction encoded signal;

receiving means for receiving the punctured convolutional error correction encoded signal transmitted from said transmitting means;

fixed bit inserting position storing means for storing said at least one inserting position;

convolutional error correction decoding means for performing a maximum likelihood decoding of the punctured convolutional error correction encoded signal while limiting a determination of a state transition corresponding to the at least one inserting position to only one kind that is decided by the fixed value to obtain an error correction decoded signal; and voice decoding means for decoding the error correction decoded signal into the voice signal.

8. An apparatus according to claim 7, wherein said at least one fixed bit comprises a single bit inserted between two consecutive bits of the information signal series.

9. An apparatus according to claim 5, wherein said maximum likelihood decoding comprises Viterbi decoding, and wherein said convolutional error correction decoding means determines only one branch from each possible state corresponding to said at least one fixed bit, whereby a probability of selecting a path in which said at least one fixed bit is erroneously decoded is set to zero.

* * * * *